(12) United States Patent
Van Gompel et al.

(10) Patent No.: US 7,037,857 B2
(45) Date of Patent: May 2, 2006

(54) METHOD FOR ELIMINATION OF EXCESSIVE FIELD OXIDE RECESS FOR THIN SI SOI

(75) Inventors: Toni D. Van Gompel, Austin, TX (US); Mark D. Hall, Austin, TX (US); Mohamad Jahanbani, Austin, TX (US); Michael D. Turner, San Antonio, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/737,115

(22) Filed: Dec. 16, 2003

(65) Prior Publication Data

US 2005/0130359 A1    Jun. 16, 2005

(51) Int. Cl.
*H01L 21/3205*    (2006.01)
*H01L 21/31*    (2006.01)

(52) U.S. Cl. ...................... 438/761; 438/585
(58) Field of Classification Search ............... 438/197, 438/479, 584, 585, 758, 761, 763
See application file for complete search history.

(56) References Cited

U.S. PATENT DOCUMENTS

| | | | |
|---|---|---|---|
| 6,524,929 B1 | 2/2003 | Xiang et al. | |
| 6,534,379 B1 | 3/2003 | Fisher et al. | |
| 6,833,295 B1 * | 12/2004 | Kajita | 438/197 |
| 2003/0181049 A1 | 9/2003 | Huang et al. | |

* cited by examiner

*Primary Examiner*—Scott Geyer
(74) *Attorney, Agent, or Firm*—Michael J. Balconi-Lamica; James L. Clingan, Jr.

(57) ABSTRACT

A method for forming trench isolation in an SOI substrate begins with a pad oxide followed by an antireflective coating (ARC) over the upper semiconductor layer of the SOI substrate. The pad oxide is kept to a thickness not greater than about 100 Angstroms. An opening is formed for the trench isolation that extends into the oxide below the upper semiconductor layer to expose a surface thereof. The pad oxide is recessed along its sidewall with an isotropic etch. This is followed by a thin, not greater than 50 Angstroms, oxide grown along the sidewall of the opening. This grown oxide avoids forming a recess between the ARC and the pad oxide and also avoids forming a void between the surface of the lower oxide layer and the grown oxide. This results in avoiding polysilicon stringers when the subsequent polysilicon gate layer is formed.

19 Claims, 6 Drawing Sheets

METHOD FOR ELIMINATION OF EXCESSIVE FIELD OXIDE RECESS FOR THIN SI SOI

BACKGROUND

The present disclosure relates to semiconductor device processing, and more particularly, to a method and apparatus for elimination of excessive field oxide recess for Thin Si SOI.

RELATED ART

A problem in the art has been discovered to exist in connection with an excessive field oxide recess for thin silicon SOI. The excessive field oxide recess leads to moat formations or voids occurring around bitcells and other structures in SQI. The moats have been found to form as a result of HF penetration that etches an insulative fill material, such as HDP, from the sidewalls of Si (at an interface between the Si and trench isolation material), coupled with areas of weak oxide at the top of a BOX (bottom oxide), and at the top Si interface. Etching of the two weak oxide regions accelerates the removal of the isolation material from around a given structure, thereby causing recession to occur into the BOX, thus undesirably forming a moat or void.

In one example, a problem exists in the area of weak oxide found at the top of the BOX layer near the interface of a 200 Å thick liner. This area of weak oxide functions as a stress relief mechanism. When the stress relief mechanism is coupled with the recession of HDP at the sidewalls of the shallow trench isolation (STI) corner region, formation of moats occurs, leading to formation of poly stringers and depressed device yields.

Accordingly, there is a need for an improved method and apparatus for overcoming the problems in the art as discussed above.

SUMMARY

According to one embodiment, a method of making a semiconductor device includes providing a substrate having a semiconductor layer over a first insulating layer and forming a second insulating layer on the semiconductor layer having a thickness not greater than about 100 Angstroms. The method further includes forming an anti-reflective coating (ARC) on the second insulating layer, etching an opening through the ARC, the second insulating layer, and the semiconductor layer, and into the first insulating layer. Additionally, the method includes forming a third insulating layer along a sidewall of the opening, filling the opening with dielectric fill material, removing the ARC and the second insulating layer, forming a gate dielectric, forming a conductive layer on the gate dielectric, and patterning the conductive layer.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

According to the present disclosure, the embodiments eliminate various mechanisms in the formation of moat defects. For example, the embodiments eliminate a first mechanism that starts the formation of moat defects. Secondly, the embodiments address a second area that enables the moat defect, corresponding to the weak oxide at the bottom of the liner/top BOX and bottom Si interface. Accordingly, by eliminating the first and second mechanisms, the recession of the HDP by one or more HF cleans does not lead to any voids or areas for POLY stringers. Moreover, leakage current is diminished and yields for devices are improved. In one embodiment, the problems in the art are overcome by a re-engineering of an SOI integration for Thin SOI. Such a method includes, for example, changes in thicknesses for a PAD-Ox, a liner oxide, and an HDP fill process.

The first mechanism of the moat defect was discovered at the interface of the oxide and nitride, which corresponded to an approximate 35 Å undercut. The undercut was created by a pre-clean 35 Å HF that was used prior to the trench liner deposition. The Oxide thickness was on the order of 145 Å. The second mechanism was the area under the 200 Å liner at the top of the box/top of the bottom Si interface. There was significant overlap of the liner that prohibited a uniform fill at the bottom of the liner. Accordingly, the area included a void at the bottom, which became a stress relief point. Through subsequent processing, the void at the top is recessed below the Si, due to HF etching and merges with the void at the bottom, thus developing into a moat defect that extends into the BOX.

In one embodiment of the present disclosure, the areas that were found to cause the MOAT defects around bitcell devices were resolved by changing the Thin SOI integration as discussed herein. For example, a Pad Ox thickness was changed from 145 Å to 90 Å to eliminate an undercut at the Nitride/Si interface. The liner was changed from a non-uniform 200 Å liner to a uniform 40 Å liner. In addition, the pre-clean was reduced from 35 Å HF to 0 Å HF.

Figure 1:
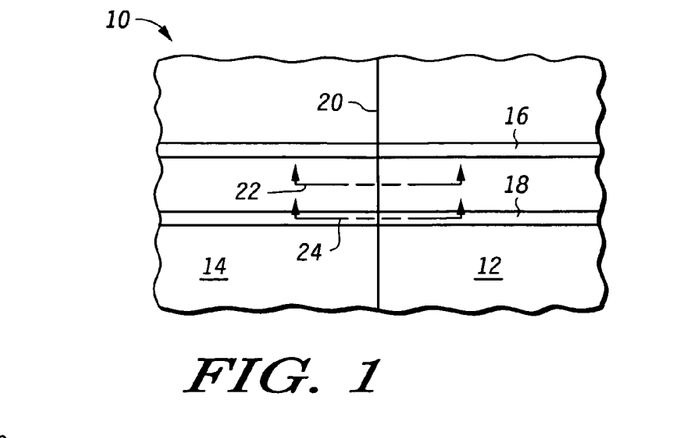
FIG. 1 is a top-down view of a portion of an SOI semiconductor device.

FIG. 1 is a top-down view of a portion of an SOI semiconductor device 10, having areas susceptible to field recessions, referred to herein as "moats." The present disclosure is directed to thin SOI semiconductor devices, wherein thin SOI refers to the silicon layer of the SOI being scaled to less than 1100 angstroms. An active region of device 10 is generally designated by the reference numeral 12. An isolation region of device 10 is generally designated by the reference numeral 14. Semiconductor device 10 further includes transistor word lines, generally designated by reference numerals 16 and 18. An interface between an active region 12 and an isolation region 14 is generally designated by reference numeral 20. While the following discussion is particular to a single interface, it is equally applicable to more than one such interface of the semiconductor device 10.

Figure 2:
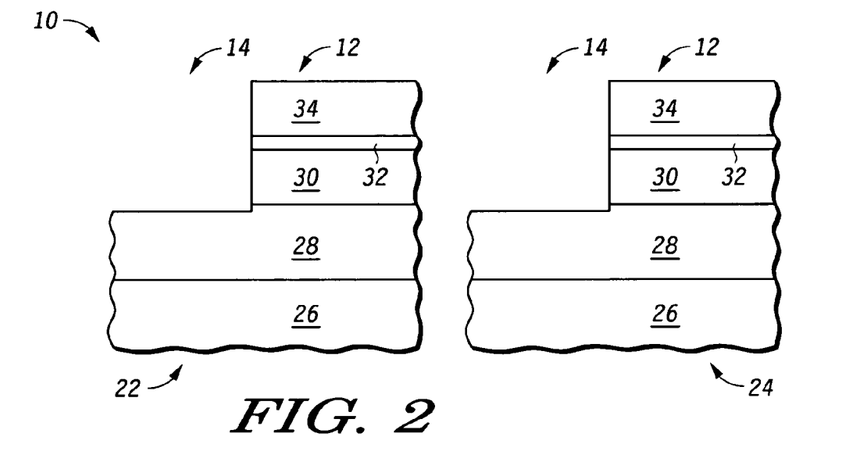
FIGS. 2–9 include cross-sectional views of the SOI semiconductor device of FIG. 1 at various steps of manufacture.

FIGS. 2–9 include cross-sectional views of the SOI semiconductor device of FIG. 1 at various steps of manufacture. Referring now to FIG. 2, two views are shown indicated by reference numerals 22 and 24 that represent cross-sectional views of an SOI semiconductor wafer that has been processed up through FEOL (front end of line) trench etch. The SOI semiconductor substrate includes a silicon substrate 26, insulator layer 28, and silicon layer 30.

In one embodiment, the SOI semiconductor substrate includes a thin SOI substrate wherein layer 30 has a thickness on the order of less than 1100 angstroms. Layers 32 and 34 represent pad oxide (pad-OX) and nitride, respectively. The pad-OX layer 32 includes a sacrificial oxide that protects the underlying silicon during processing of the active regions. Pad-OX layer 32 has a thickness on the order of less than approximately 100 Å. Nitride layer 34 has a thickness that depends on the lithographic technique used to pattern the active region (i.e., the node wavelength g-line, i-line, DUV, 193 nm, etc.). For example, the nitride layer 34 could include a thickness on the order of less than 1500 Å.

At this point in the manufacturing process, cross-sectional views 22 and 24 are similar. Note that processing of the semiconductor wafer up through FEOL trench etch results in a slight over etch into bottom oxide layer 28, also referred to herein as BOX. The over etch is on the order of zero to 100 Å. In addition, the FEOL trench etch creates a sidewall interface between the active region 12 and the isolation region 14, wherein the sidewall includes exposed area of silicon layer 30, pad-OX 32, and nitride layer 34. The sidewall will further include an exposed area of the BOX 28 resulting from the overetch, the exposed area having a depth approximately on the order of zero to 100 Å. In addition, there could potentially be an undercut (or void) at the bottom of the trench in the region of the overetch, in particular, at the silicon and BOX interface.

Figure 3:
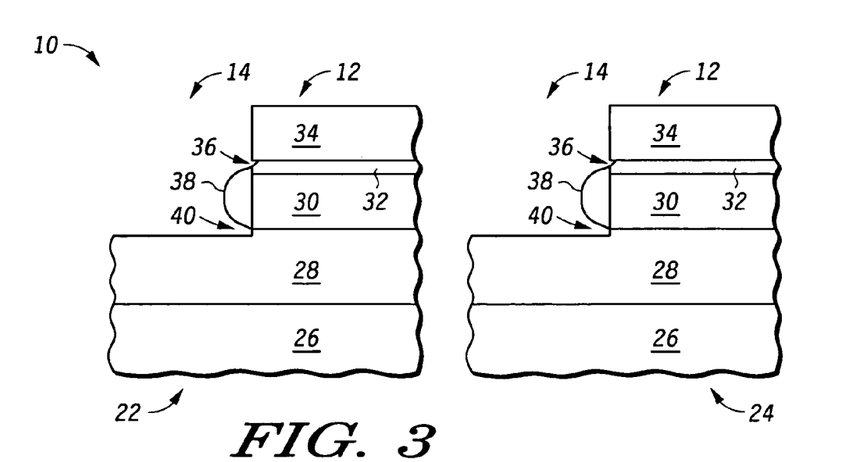

Referring now to FIG. 3, the two views indicated by reference numerals 22 and 24 are similar to those shown in FIG. 2, wherein the SOI semiconductor device 10 has been further processed up to a pre-liner, post FEOL trench etch. Accordingly, views 22 and 24 have the following differences. A cleaning operation is performed to create an undercut 36 at the nitride/pad-OX interface, to ensure a complete coverage of the subsequently formed preliner 38. Semiconductor device 10 is then processed with an oxide to form the non-conformal preliner 38 on the sidewall interface between regions 12 and 14. Non-conformal preliner 38 has a thickness that varies between on the order of 100–250 Å. Formation of the non-conformal preliner 38 also creates a void region 40, wherein the void region can include a vacancy, cavity, crevice, open region or the like. The void region 40 becomes significant during further processing that occurs post pre-liner.

Figure 4:
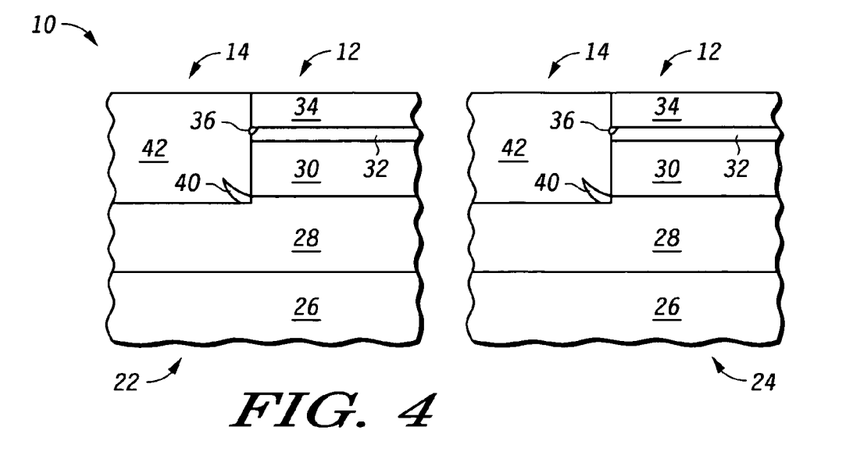

Referring now to FIG. 4, the two views indicated by reference numerals 22 and 24 are similar to those shown in FIG. 3, wherein the SOI semiconductor device 10 has been further processed with a fill step, densification and CMP (chemical mechanical polish), up to post-CMP, post preliner. Accordingly, views 22 and 24 have the following differences. The fill step deposits insulator 42, wherein insulator 42 includes a dielectric material. In one embodiment, insulator 42 includes a high density plasma (HDP) oxide. In addition, the fill step causes preliner 38 to become indistinguishable from insulator 42, since the preliner and insulator are based upon a similar material. However, as a result of directional filling of insulator 42 in the trench being insufficient, the fill step results in changing undercut 36 and void region 40 becoming defined regions, such as, a defined vacancy, cavity, crevice, open region or the like. Densification can cause elongation of the void region 40 below the preliner 38. CMP reduces a thickness of the insulator 42 and nitride 34.

Figure 5:
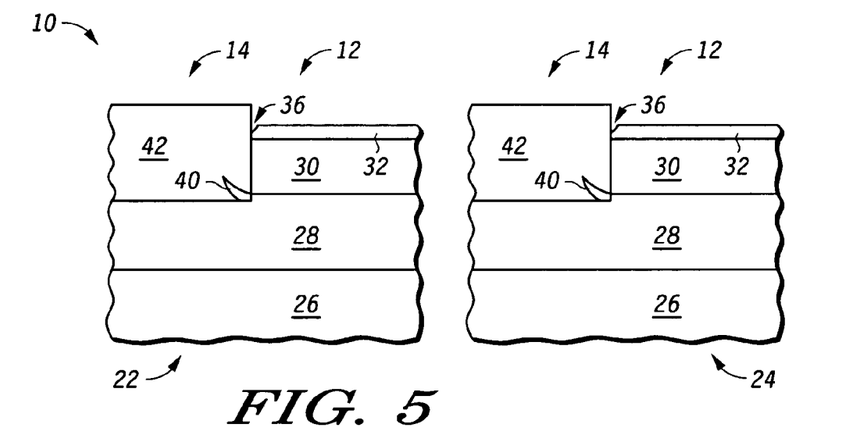

Referring now to FIG. 5, the two views indicated by reference numerals 22 and 24 are similar to those shown in FIG. 4, wherein the SOI semiconductor device 10 has been further processed with a nitride removal step. Accordingly, views 22 and 24 have the following difference. Nitride 34 has been removed, wherein nitride removal highlights (i.e., amplifies) the void region 36 in the pad-OX at the sidewall interface between regions 12 and 14.

Figure 6:
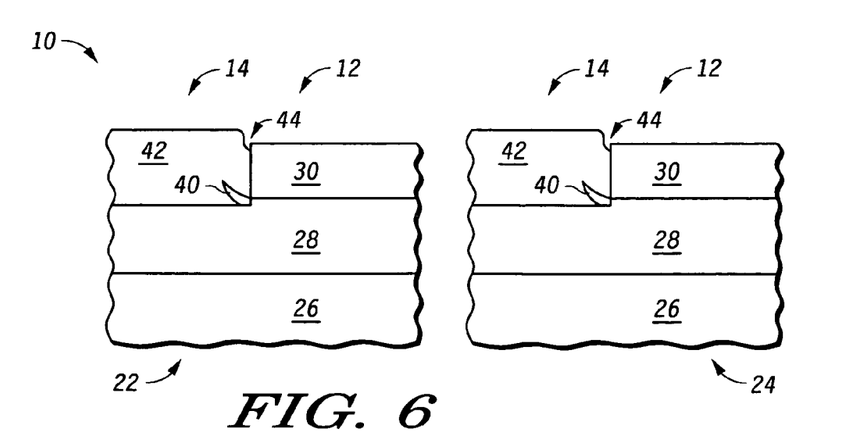

Referring now to FIG. 6, the two views indicated by reference numerals 22 and 24 are similar to those shown in FIG. 5, wherein the SOI semiconductor device 10 has been further processed with a pad-OX removal step. Accordingly, views 22 and 24 have the following differences. Pad-OX layer 32 is removed with a suitable clean, such as an HF clean. The HF clean forms a corner recession (or divot) at the sidewall interface between regions 12 and 14, as indicated by reference numeral 44.

Figure 7:
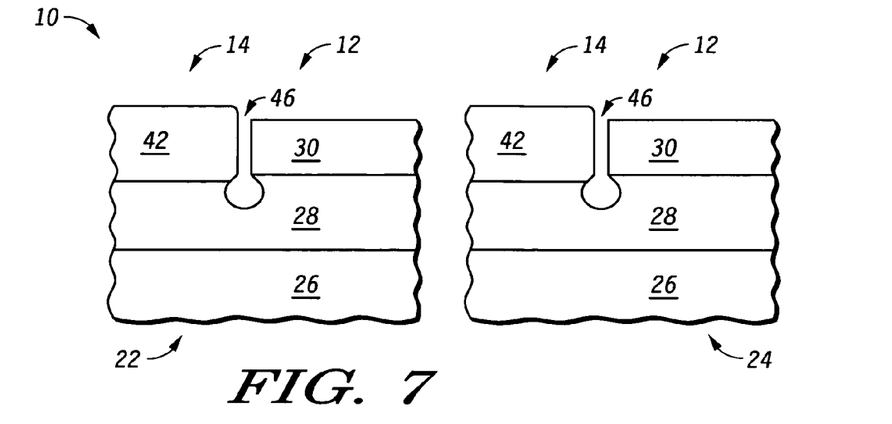

Referring now to FIG. 7, the two views indicated by reference numerals 22 and 24 are similar to those shown in FIG. 6, wherein the SOI semiconductor device 10 has been further processed with subsequent oxide strips. Accordingly, views 22 and 24 have the following differences. The subsequent oxide strips etch insulator 42, beginning at divot 44 and continuing down to underlying void 40, thereby forming a moat at the sidewall interface between regions 12 and 14, as indicated by reference numeral 46.

Figure 8:
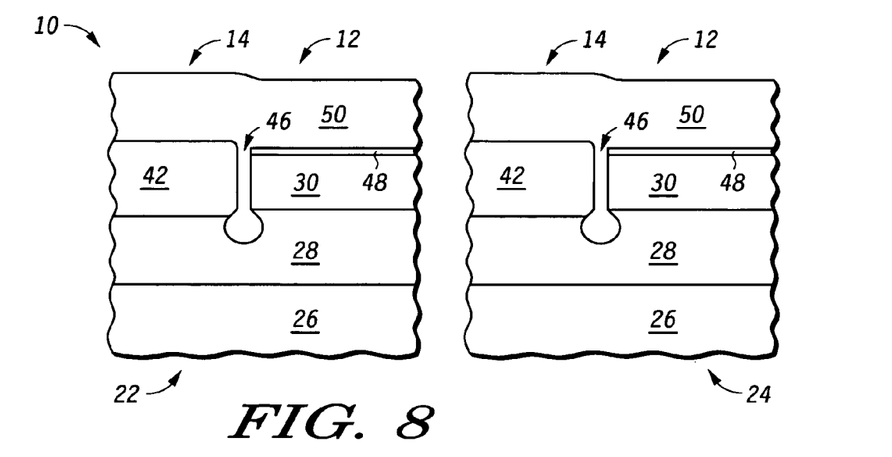

Referring now to FIG. 8, the two views indicated by reference numerals 22 and 24 are similar to those shown in FIG. 7, wherein the SOI semiconductor device 10 has been further processed with a subsequent gate oxide and polysilicon steps. Accordingly, views 22 and 24 have the following differences. The gate oxide step forms gate oxide 48. The polysilicon step forms a blanket polysilicon layer 50, over previously defined STI Active regions. During the polysilicon step, polysilicon deposits within the moat 46.

Figure 9:
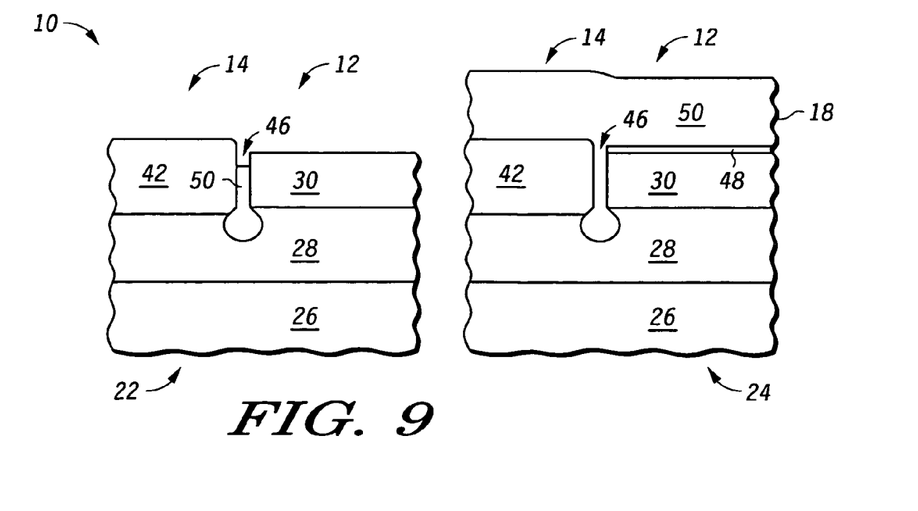

Referring now to FIG. 9, the two views indicated by reference numerals 22 and 24 are similar to those shown in FIG. 8, wherein the SOI semiconductor device 10 has been further processed with a subsequent gate patterning step where defined on an STI active region (view 24 of FIG. 1), and where not-defined, the polysilicon and gate oxide are removed (view 22 of FIG. 1). Accordingly, views 22 and 24 of FIG. 9 have the following differences. In view 22 of FIG. 9, polysilicon 50 and gate oxide 48 are removed, with the exception that some residual polysilicon remains within moat 46. In view 24 of FIG. 9, the gate polysilicon includes polysilicon within moat 46, wherein the moat 46 of view 24 is the same moat 46 as referenced in view 22. This causes a hard bit failure, corresponding to a permanent breakdown of a bit in an array of the SOI semiconductor device 10.

Figure 10:
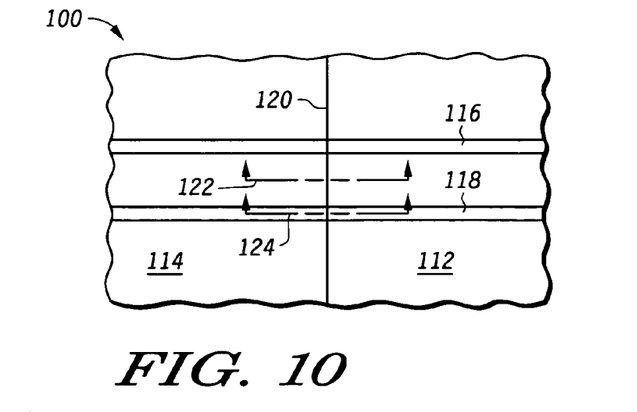
FIG. 10 is a top-down view of a portion of an SOI semiconductor device according to an embodiment of the present disclosure.

FIG. 10 is a top-down view of a portion of an SOI semiconductor device 110, having areas not susceptible to field recessions, which have been referred to herein as "moats." An active region of device 110 is generally designated by the reference numeral 112. An isolation region of device 110 is generally designated by the reference numeral 114. Semiconductor device 110 further includes transistor word lines, generally designated by reference numerals 116 and 118. An interface between an active region 112 and an isolation region 114 is generally designated by reference numeral 120. While the following discussion is particular to a single interface, it is equally applicable to more than one such interface of the semiconductor device 110.

Figure 11:
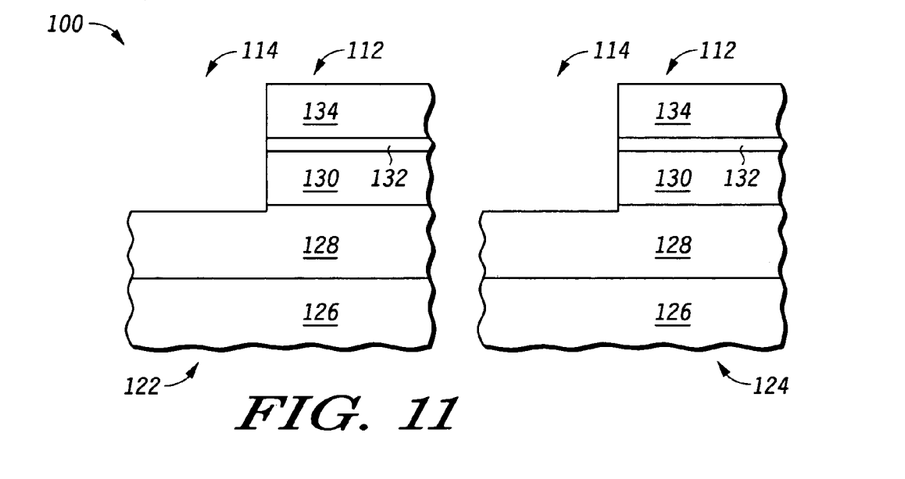
FIGS. 11–18 include cross-sectional views of the SOI semiconductor device of FIG. 10 at various steps of manufacture according to an embodiment of the present disclosure.

FIGS. 11–18 include cross-sectional views of the SOI semiconductor device of FIG. 10 at various steps of manufacture. Referring now to FIG. 11, two views are shown indicated by reference numerals 122 and 124 that represent cross-sectional views of an SOI semiconductor wafer that has been processed up through FEOL (front end of line) trench etch. The SOI semiconductor substrate includes a silicon substrate 126, insulator layer 128, and silicon layer 130.

In one embodiment, the SOI semiconductor substrate includes a thin SOI substrate wherein layer 130 has a thickness on the order of less than 1100 Å. Layers 132 and 134 represent pad oxide (pad-OX) and nitride, respectively. The pad-OX layer 132 includes a sacrificial oxide that protects the underlying silicon during processing of the active regions. Pad-OX layer 132 has a thickness on the order of less than approximately 100 Å. Nitride layer 134 has a thickness that depends on the lithographic technique used to pattern the active region (i.e., the node wavelength g-line, i-line, DUV, 193 nm, etc.). For example, the nitride layer 134 could include a thickness on the order of less than 1500 Å.

At this point in the manufacturing process, cross-sectional views 122 and 124 are similar. Note that processing of the semiconductor wafer up through FEOL trench etch results in a slight over etch into bottom oxide layer 128, also referred to herein as BOX. The over etch is on the order of zero to 100 Å. In addition, the FEOL trench etch creates a sidewall interface between the active region 112 and the isolation region 114, wherein the sidewall includes exposed area of silicon layer 130, pad-OX 132, and nitride layer 134. The sidewall will further include an exposed area of the BOX 128 resulting from the overetch, the exposed area having a depth approximately on the order of zero to 50 Å. Accordingly, the potential for creation of an undercut (or void) at the bottom of the trench in the region of the overetch, in particular, at the silicon and BOX interface, is minimized.

Figure 12:
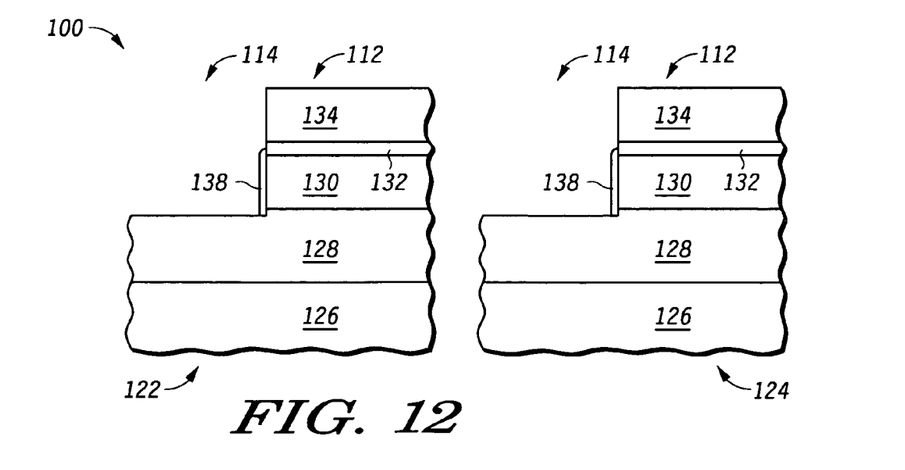

Referring now to FIG. 12, the two views indicated by reference numerals 122 and 124 are similar to those shown in FIG. 11, wherein the SOI semiconductor device 110 has been further processed up to a pre-liner, post FEOL trench etch. Accordingly, views 122 and 124 have the following differences. A cleaning operation is performed, however, using a diluted cleaning operation so as avoid creating an undercut at the nitride/pad-OX interface. Semiconductor device 110 is then processed with an oxide to form a substantially conformal preliner 138 on the sidewall interface between regions 112 and 114. Conformal preliner 138 has a substantially uniform thickness on the order of less than 50 Å. Formation of the conformal preliner 138 also reduces the potential for creation of a void region, vacancy, cavity, crevice, or the like, at a bottom portion of the conformal preliner 138. The absence of a void region becomes significant during further processing that occurs post pre-liner.

Figure 13:
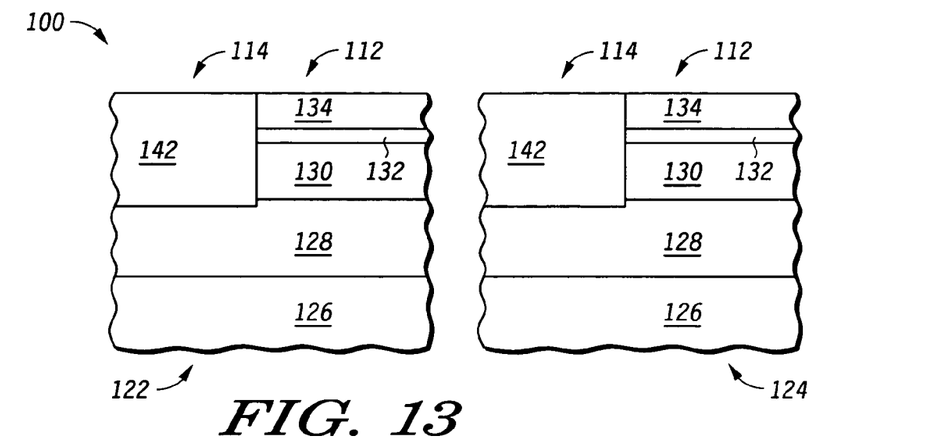

Referring now to FIG. 13, the two views indicated by reference numerals 122 and 124 are similar to those shown in FIG. 12, wherein the SOI semiconductor device 110 has been further processed with a fill step, densification and CMP (chemical mechanical polish), up to post-CMP, post pre-liner. Accordingly, views 122 and 124 have the following differences. The fill step deposits insulator 142, wherein insulator 142 includes a dielectric material. In one embodiment, insulator 142 includes a high density plasma (HDP) oxide. In addition, the fill step causes preliner 138 to become indistinguishable from insulator 142, since the preliner and insulator are based upon a similar material. As a result of directional filling of insulator 142 in the trench, the fill step results in a complete filling of the trench without creation of void regions. CMP reduces a thickness of the insulator 142 and nitride 134.

Figure 14:
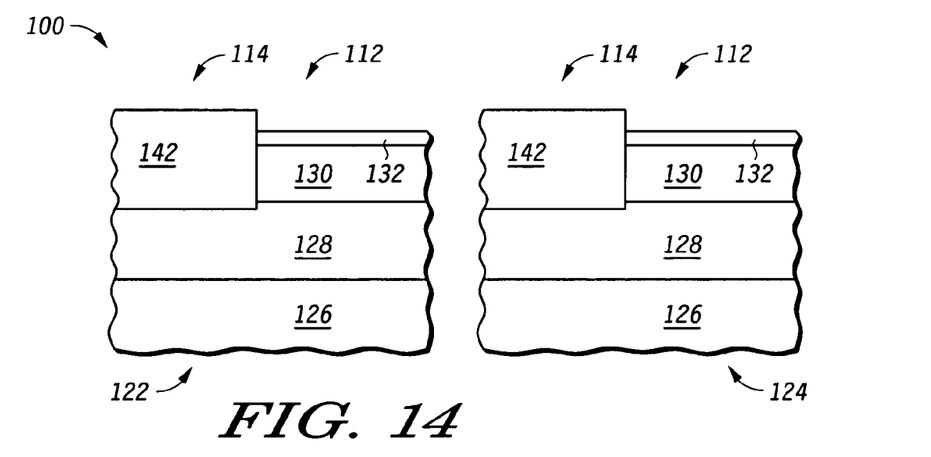

Referring now to FIG. 14, the two views indicated by reference numerals 122 and 124 are similar to those shown in FIG. 13, wherein the SOI semiconductor device 110 has been further processed with a nitride removal step. Accordingly, views 122 and 124 have the following difference. Nitride 134 has been removed, wherein nitride removal has minimal effects on the pad-OX at the sidewall interface between regions 112 and 114.

Figure 15:
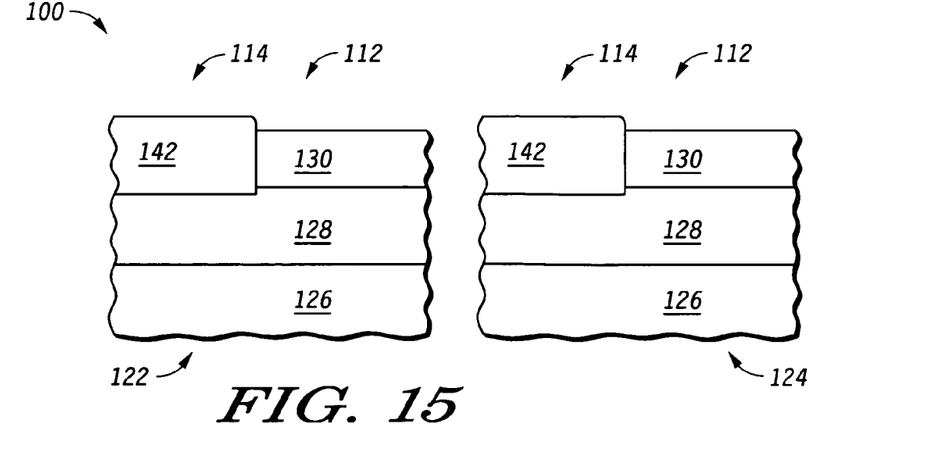

Referring now to FIG. 15, the two views indicated by reference numerals 122 and 124 are similar to those shown in FIG. 14, wherein the SOI semiconductor device 110 has been further processed with a pad-OX removal step. Accordingly, views 122 and 124 have the following differences. Pad-OX layer 132 is removed with a suitable clean, such as an HF clean. In view of an absence of a void in the pad-OX at the interface of region 112 and 114, the HF clean does not form a corner recession (or divot) at the sidewall interface between regions 112 and 114.

Figure 16:
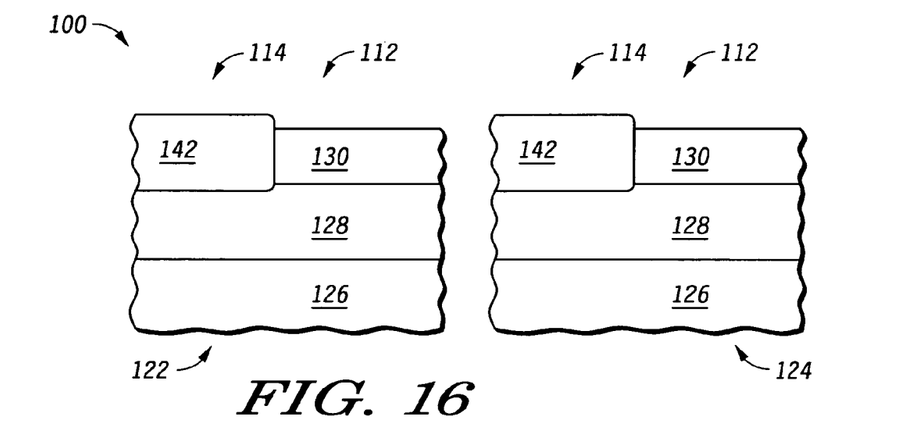

Referring now to FIG. 16, the two views indicated by reference numerals 122 and 124 are similar to those shown in FIG. 15, wherein the SOI semiconductor device 110 has been further processed with subsequent oxide strips. Accordingly, views 122 and 124 have the following differences. The subsequent oxide strips etch insulator 142 on the order of approximately 95 Å, wherein the oxide strips include non-preferential etches. Accordingly, the oxide strips do not form a moat at the sidewall interface between regions 112 and 114.

Figure 17:
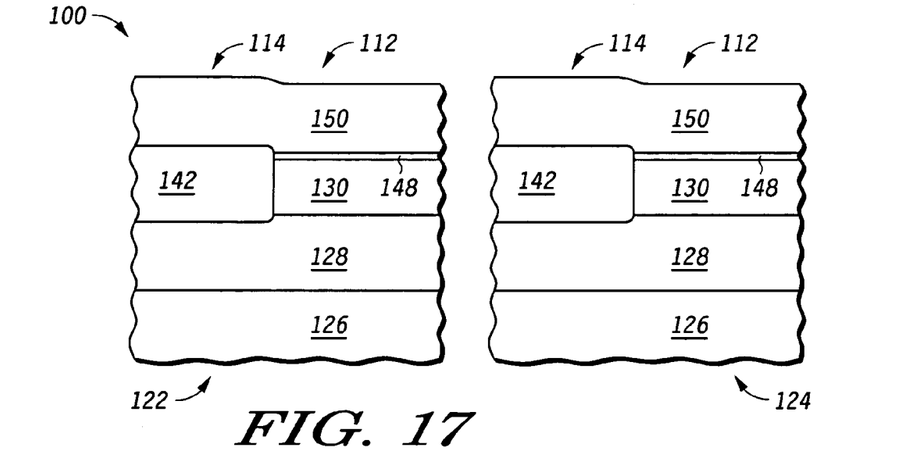

Referring now to FIG. 17, the two views indicated by reference numerals 122 and 124 are similar to those shown in FIG. 16, wherein the SOI semiconductor device 110 has been further processed with a subsequent gate oxide and polysilicon steps. Accordingly, views 122 and 124 have the following differences. The gate oxide step forms gate oxide 148. The polysilicon step forms a blanket polysilicon layer 150, over previously defined STI Active regions. During the polysilicon step, polysilicon is fairly planar and no moats are present to fill.

Figure 18:
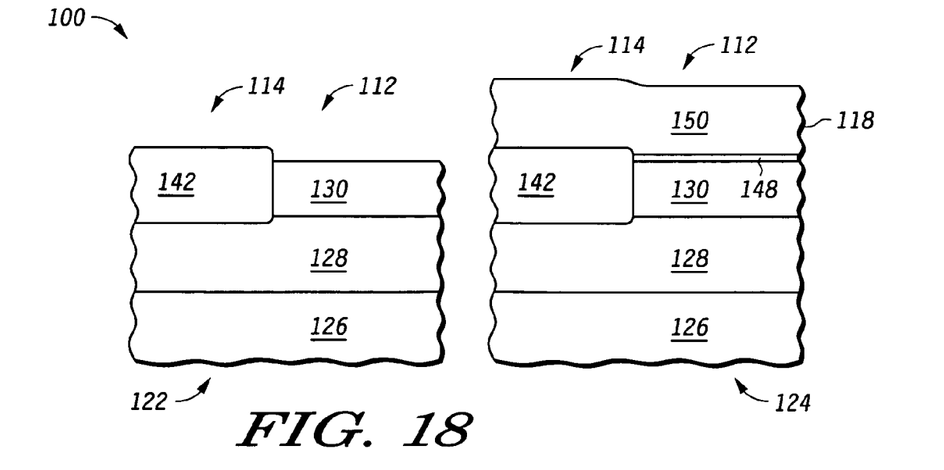

Referring now to FIG. 18, the two views indicated by reference numerals 122 and 124 are similar to those shown in FIG. 17, wherein the SOI semiconductor device 110 has been further processed with a subsequent gate patterning step where defined on an STI active region (view 124 of FIG. 10), and where not-defined, the polysilicon and gate oxide are removed (view 122 of FIG. 10). Accordingly, views 122 and 124 of FIG. 18 have the following differences. In view 122 of FIG. 18, polysilicon 150 and gate oxide 148 are removed, and no polysilicon remains that would cause a short as in the prior integration of FIGS. 1–9. In view 124 of FIG. 18, the gate polysilicon is free of any active regions with moats as in the prior integration of FIGS. 1–9. Accordingly, hard bit failures are advantageously avoided in an array of the SQL semiconductor device 110.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The various embodiments disclosed herein make use of semiconductor processing techniques known in the art and thus are not described in detail herein.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of making a semiconductor device, comprising:
   providing a substrate having a semiconductor layer over a first insulating layer;
   forming a second insulating layer on the semiconductor layer having a thickness not greater than about 100 Angstroms;
   forming an anti-reflective coating (ARC) on the second insulating layer;
   etching an opening through the ARC, the second insulating layer, and the semiconductor layer, and into the first insulating layer;
   forming a third insulating layer along a sidewall of the opening;
   filling the opening with dielectric fill material;
   removing the ARC and the second insulating layer; forming a gate dielectric;
   forming a conductive layer on the gate dielectric; and
   patterning the conductive layer.

2. The method of claim 1, wherein the filling the opening comprises depositing oxide by high density plasma.

3. The method of claim 1, wherein the forming the third insulating layer comprises growing oxide.

4. The method of claim 1, further comprising applying a wet etch prior to forming the third insulating layer and after forming the opening.

5. The method of claim 1, wherein the conductive layer is polysilicon.

6. The method of claim 1, wherein the conductive layer further comprises silicide.

7. The method of claim 1, wherein the second insulating layer has a thickness of not greater than 100 Angstroms.

8. A method of preparing a semiconductor device for formation of a gate, comprising:
   providing a semiconductor substrate having a semiconductor layer over a first insulating layer;
   forming a second insulating layer on the semiconductor layer having a thickness that is not greater than about 100 Angstroms;
   etching an opening through the second insulating layer, and the semiconductor layer, and into the first insulating layer to expose a surface of the first insulating layer;
   forming a third insulating layer along a sidewall of the opening without forming a void between the third insulating layer and the surface of the first insulating layer; and
   filling the opening with dielectric fill material.

9. The method of claim 8, further comprising,
   forming a fourth insulating layer over the second insulating layer prior to forming the third insulating layer; and
   performing an isotropic etch prior to forming the fourth insulating layer to cause a recess in the second insulating layer;
   wherein
   the forming the third insulating layer avoids formation of an undercut region in the second insulating layer.

10. The method of claim 8, wherein the third insulating layer is not greater than 50 Angstroms.

11. The method of claim 8, further comprising:
    removing the second insulating layer; and
    forming a gate dielectric on the semiconductor layer.

12. A method of making a semiconductor device, comprising:
    providing a substrate having a semiconductor layer over a first insulating layer;
    forming a second insulating layer on the semiconductor layer;
    forming an anti-reflective coating (ARC) on the second insulating layer;
    etching an opening through ARC, the second insulating layer, and the semiconductor layer, and into the first insulating layer;
    forming a third insulating layer along a sidewall of the opening having a width not greater than 50 Angstroms;
    filling the opening with dielectric fill material;
    removing the ARC and the second insulating layer;
    forming a gate dielectric;
    forming a conductive layer on the gate dielectric; and
    patterning the conductive layer.

13. The method of claim 12 wherein the second insulating layer has a thickness not greater than 100 Angstroms.

14. The method of claim 12, wherein filling the opening comprises depositing oxide by high density plasma.

15. The method of claim 12, wherein the forming the third insulating layer comprises growing oxide.

16. The method of claim 12, further comprising performing an isotropic etch prior to forming the third insulating layer and after forming the opening.

17. The method of claim 12, wherein the conductive layer is polysilicon.

18. The method of claim 17, wherein the conductive layer further comprises suicide.

19. The method of claim 12, wherein the etching the opening is further characterized as etching no more than 50 Angstroms into the first insulating layer.

* * * * *

UNITED STATES PATENT AND TRADEMARK OFFICE
CERTIFICATE OF CORRECTION

| | |
|---|---|
| PATENT NO. | : 7,037,857 B2 |
| APPLICATION NO. | : 10/737115 |
| DATED | : May 2, 2006 |
| INVENTOR(S) | : Toni D. Van Gompel et al. |

It is certified that error appears in the above-identified patent and that said Letters Patent is hereby corrected as shown below:

Column 8, Line 51, Claim No. 18:

Change "further comprises suicide" to --further comprises silicide--

Signed and Sealed this

Third Day of June, 2008

JON W. DUDAS
*Director of the United States Patent and Trademark Office*